(12) United States Patent
Yuk et al.

(10) Patent No.: US 11,393,655 B2
(45) Date of Patent: Jul. 19, 2022

(54) LIQUID CHIP FOR ELECTRON MICROSCOPE INCLUDING ELECTRODE

(71) Applicant: KOREA ADVANCED INSTITUTE OF SCIENCE AND TECHNOLOGY, Daejeon (KR)

(72) Inventors: Jongmin Yuk, Daejeon (KR); Kunmo Koo, Daejeon (KR); Jaesang Lee, Daejeon (KR)

(73) Assignee: Korea Advanced Institute of Science And Technology, Daejeon (KR)

( * ) Notice: Subject to any disclaimer, the term of this patent is extended or adjusted under 35 U.S.C. 154(b) by 59 days.

(21) Appl. No.: 16/990,083

(22) Filed: Aug. 11, 2020

(65) Prior Publication Data
US 2021/0118643 A1 Apr. 22, 2021

(30) Foreign Application Priority Data
Oct. 17, 2019 (KR) .................. 10-2019-0129230

(51) Int. Cl.
  *H01J 37/20* (2006.01)
  *H01J 37/32* (2006.01)
  *H01J 37/26* (2006.01)
(52) U.S. Cl.
  CPC ............ *H01J 37/20* (2013.01); *H01J 37/265* (2013.01); *H01J 37/3255* (2013.01)
(58) Field of Classification Search
  CPC ...... H01J 37/20; H01J 37/265; H01J 37/3255; H01J 37/26; H01J 2237/2003;
  (Continued)

(56) References Cited

U.S. PATENT DOCUMENTS 9,449,787 B2 * 9/2016 Adiga ................. H01J 37/20
2008/0179518 A1 * 7/2008 Creemer .............. H01J 37/26
                                                        250/311

(Continued)

FOREIGN PATENT DOCUMENTS

| JP | 2016-110877 A | 6/2016 |
| JP | 2018085349 A | 5/2018 |
| KR | 101971825 B | 4/2019 |

OTHER PUBLICATIONS

A Korean Office Action dated Apr. 7, 2021 in connection with Korean Patent Application No. 10-2019-0129230 which corresponds to the above-referenced U.S. application.

*Primary Examiner* — David A Vanore
(74) *Attorney, Agent, or Firm* — Ivenstone Patent, LLC

(57) ABSTRACT

The present disclosure relates to a liquid chip for an electron microscope including a lower chip, an upper chip, and a waterway space part for supplying a liquid sample, and may attach a transmissive thin film layer made of a graphene material having an excellent bulging resistance property to a plurality of holes formed in a waterway space part to increase the thickness of a support not operating as a transmissive window to be larger than the conventional one, thereby supplying the liquid sample more stably and minimizing the loss of a spatial resolution and also suppressing the bulging phenomenon of the transmissive window.

To this end, according to the present disclosure, the lower chip includes a lower substrate formed with a lower cavity; a lower support disposed on the upper surface of the lower substrate, and formed with a plurality of lower holes in the lower cavity region; a spacer located on both ends of the lower support of the lower hole; and a lower transmissive thin film layer attached on the lower support so as to cover the lower hole, the upper chip includes an upper substrate formed with an upper cavity; an upper support disposed on (Continued)

the upper surface of the upper substrate, and formed with a plurality of upper holes in the upper cavity region; and an upper transmissive thin film layer having a constant bulging resistance property attached on the upper support so as to cover the plurality of upper holes, the waterway space part is formed by laminating the upper support disposed on the upper surface of the upper substrate on the spacer of the lower chip, and the transmissive thin film layer is located inside the waterway space part.

18 Claims, 17 Drawing Sheets

(58) Field of Classification Search
CPC ....... H01J 2237/2008; H01J 2237/2065; H01J 2237/2007; G01N 23/2204
See application file for complete search history.

(56) References Cited

U.S. PATENT DOCUMENTS

| | | | |
|---|---|---|---|
| 2012/0120226 A1* | 5/2012 | de Jonge | G01N 23/2251 348/80 |
| 2012/0182548 A1* | 7/2012 | Harb | G01N 29/222 356/246 |
| 2012/0298883 A1* | 11/2012 | Grogan | H01J 37/20 250/440.11 |
| 2016/0042912 A1* | 2/2016 | Adiga | H01J 37/26 250/440.11 |
| 2017/0213692 A1* | 7/2017 | Yu | H01J 37/16 |
| 2017/0292927 A1* | 10/2017 | Chang | B01L 3/5027 |
| 2018/0136148 A1* | 5/2018 | Zhang | G01N 23/2204 |
| 2019/0107504 A1* | 4/2019 | Nagashima | G01N 27/30 |
| 2020/0240933 A1* | 7/2020 | Yuk | G01N 23/2251 |

* cited by examiner

[FIG. 1]
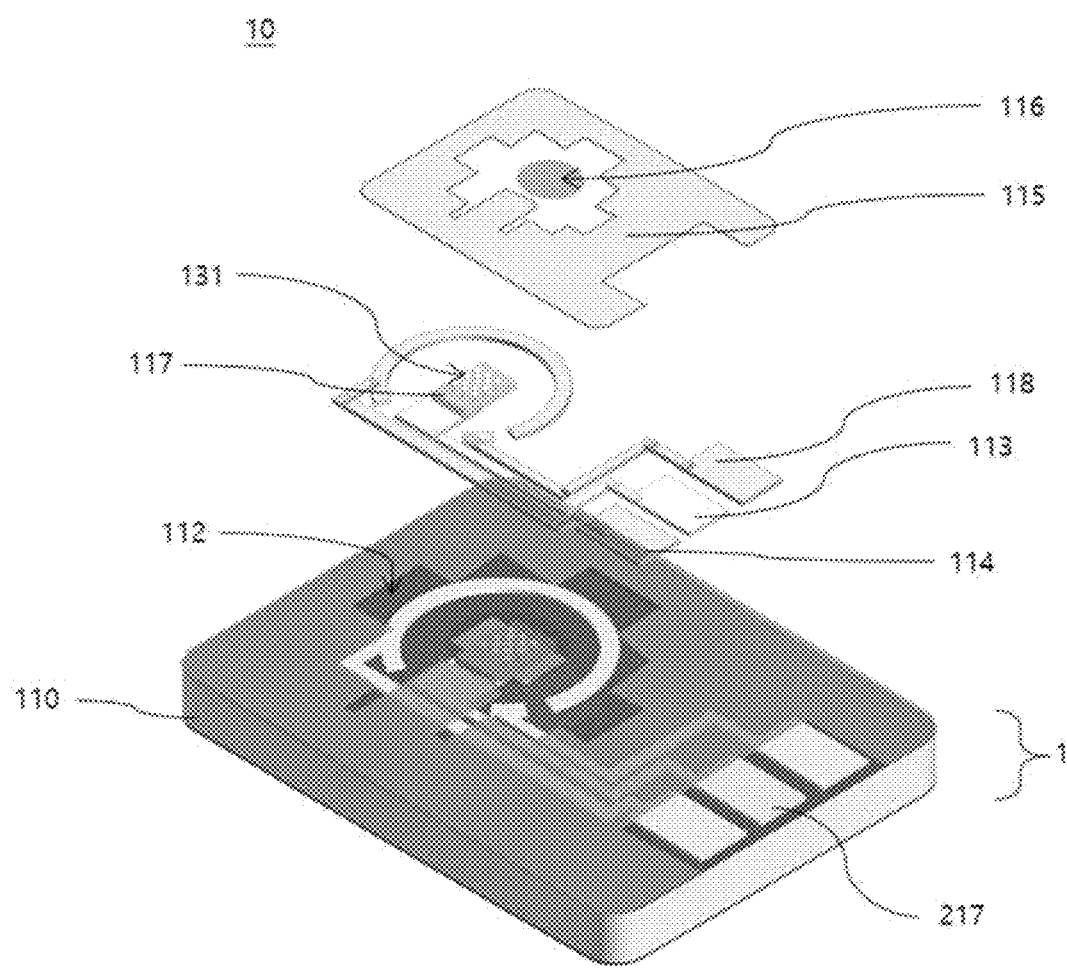

[FIG. 2]
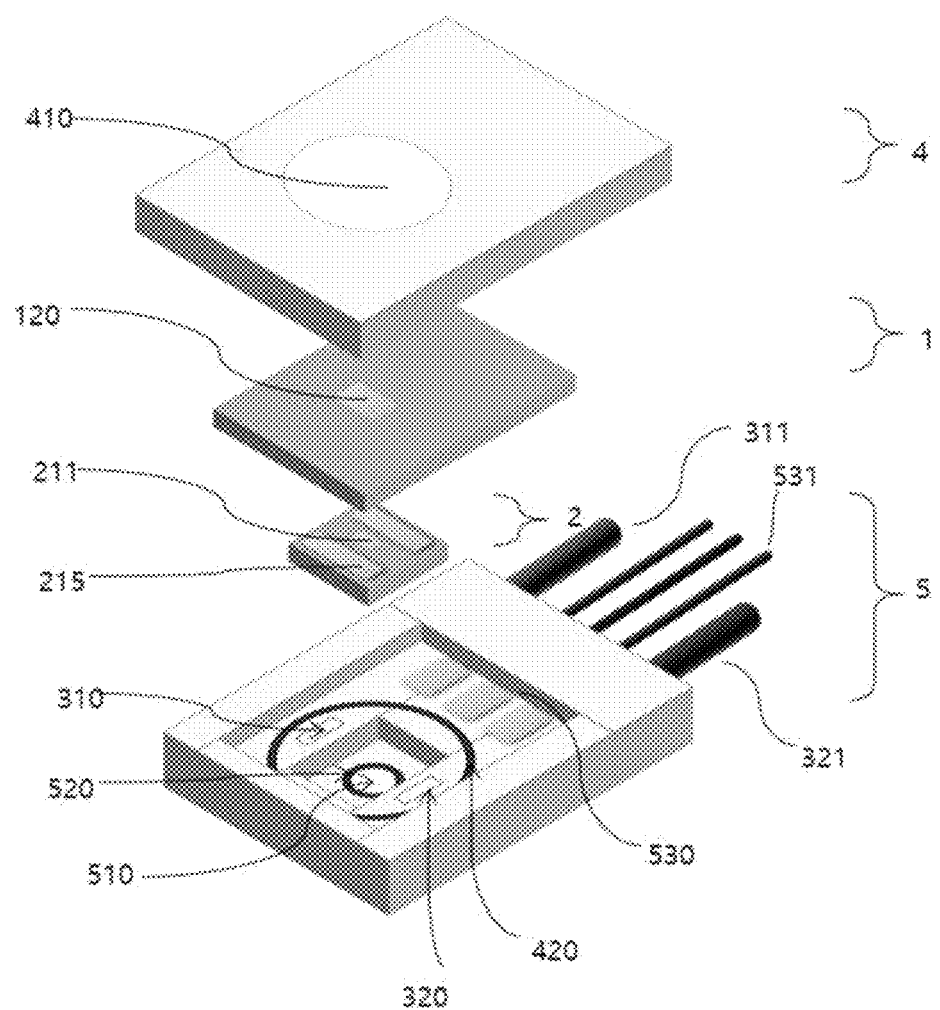

[FIG. 3A]
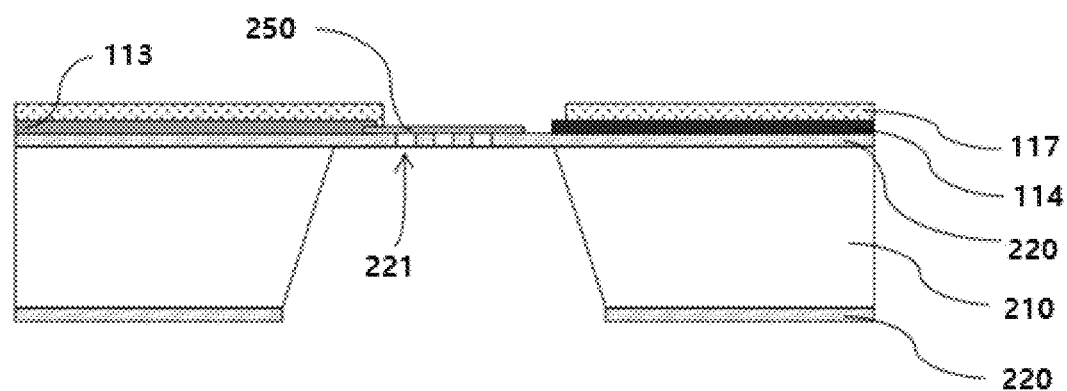
[FIG. 3B]
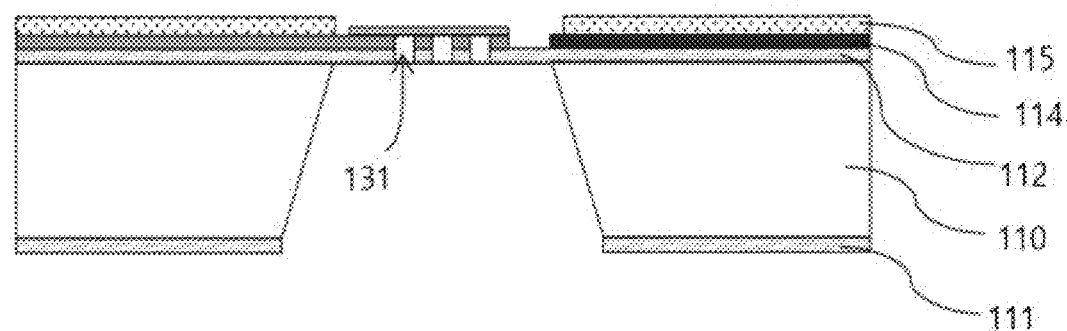

[FIG. 3C]
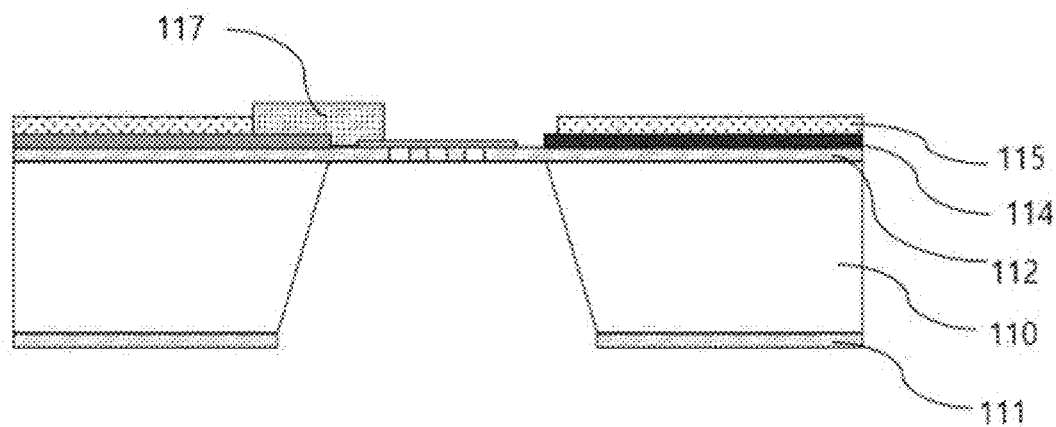
[FIG. 3D]
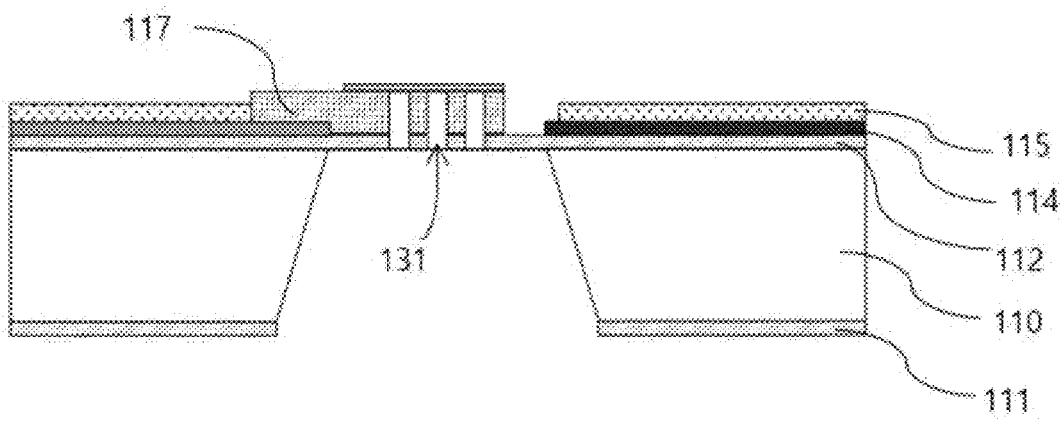

[FIG. 4]
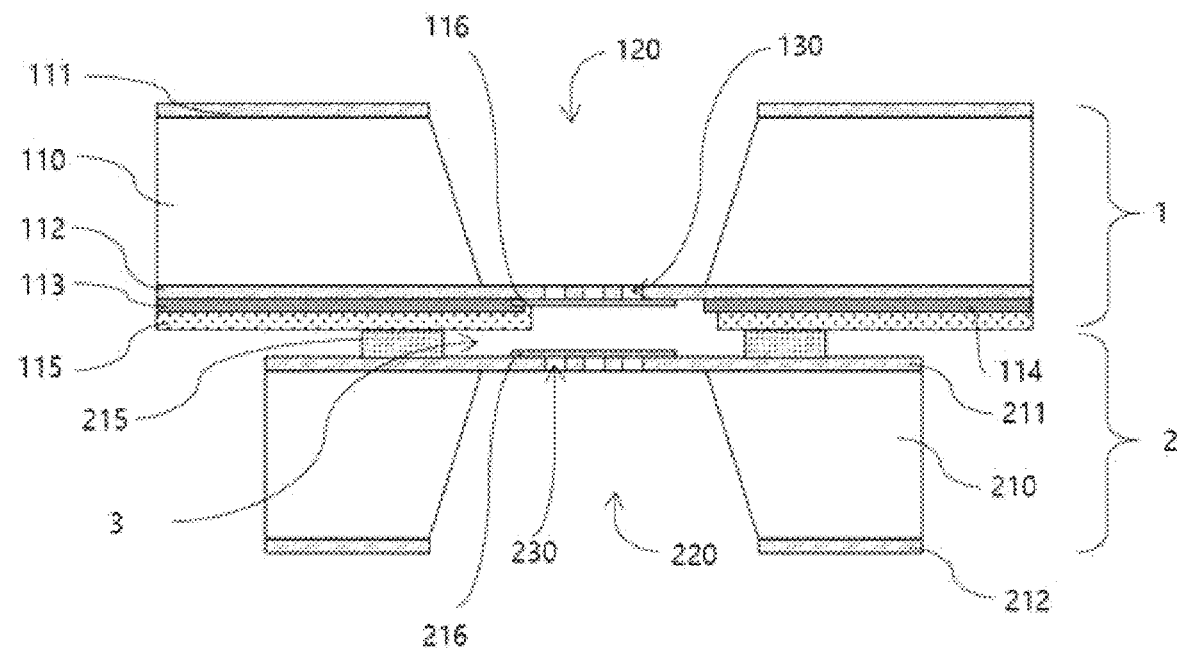
[FIG. 5]
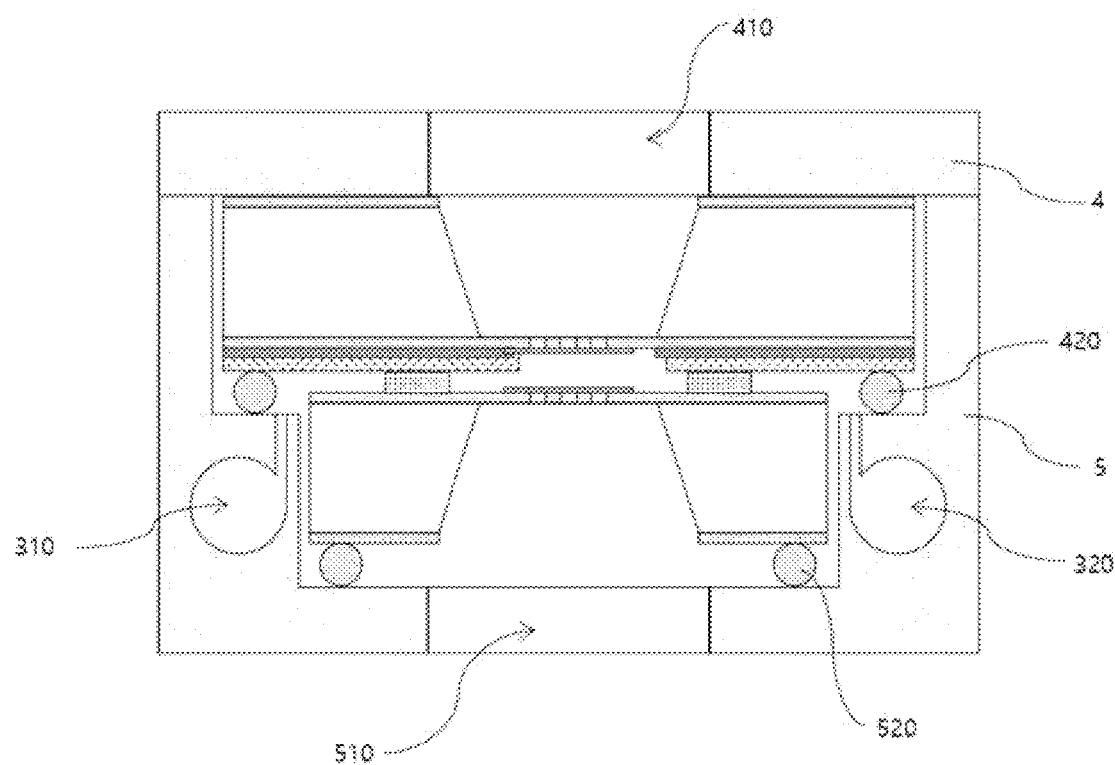

[FIG. 6]
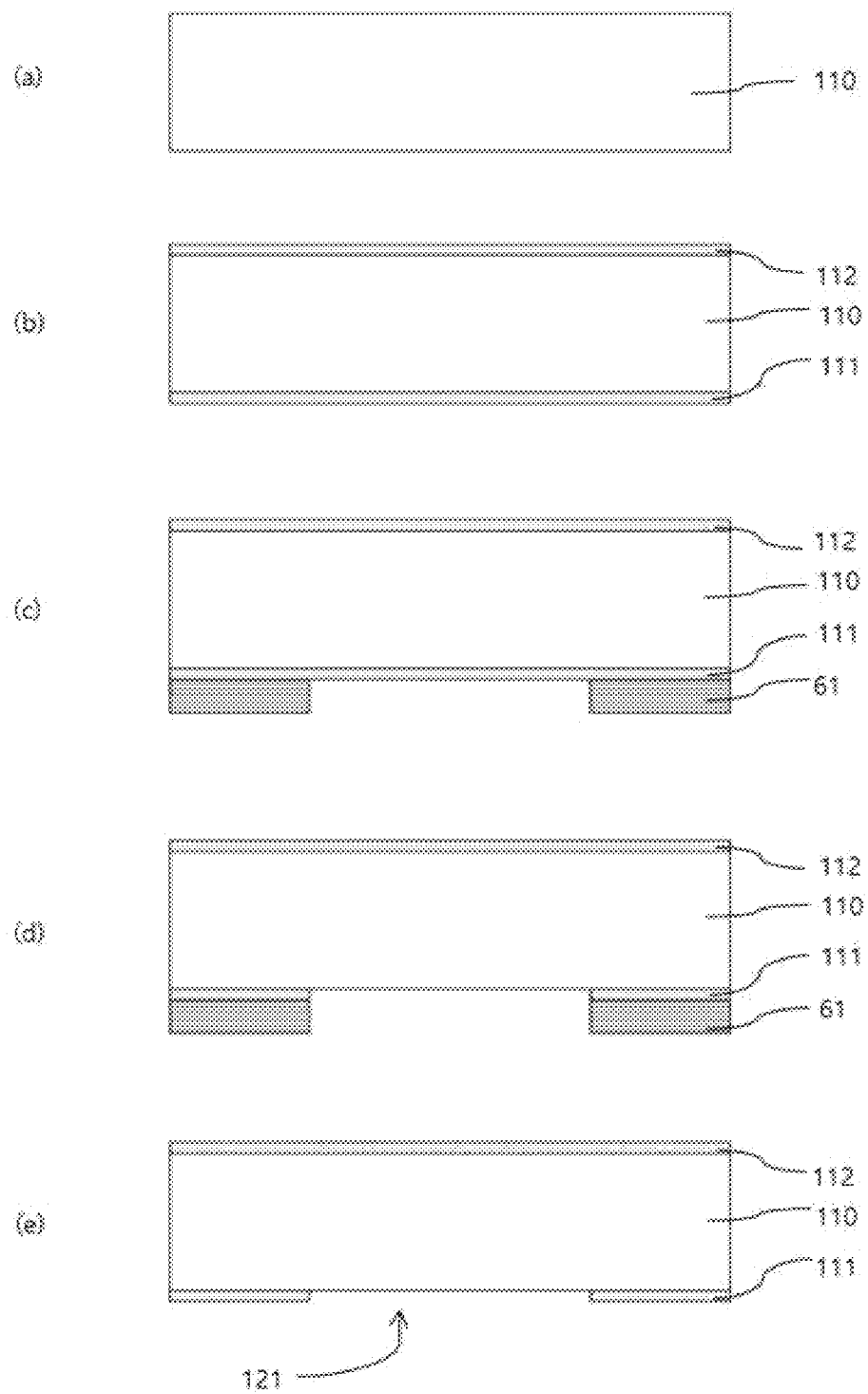

[FIG. 7]
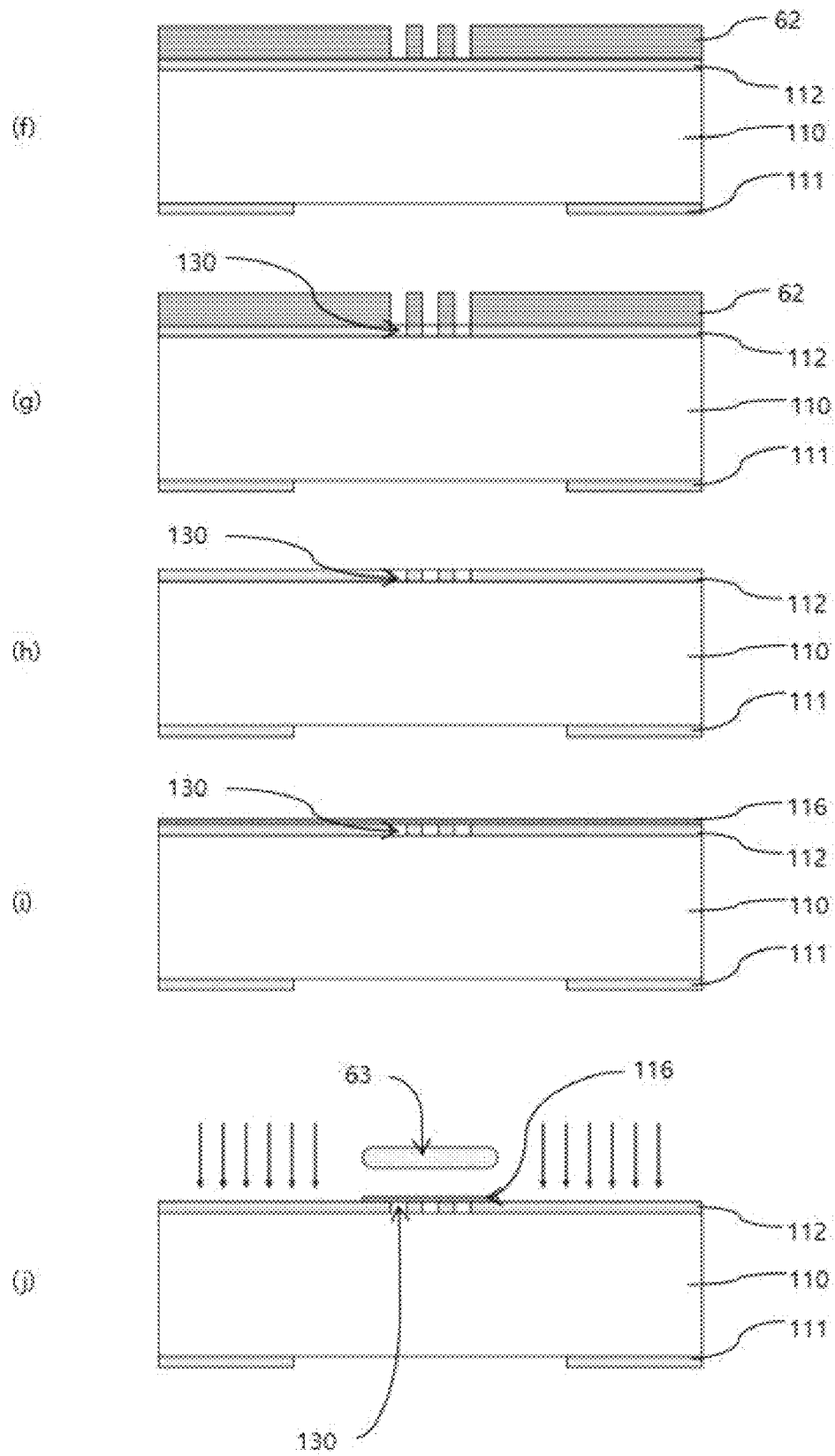

[FIG. 8]
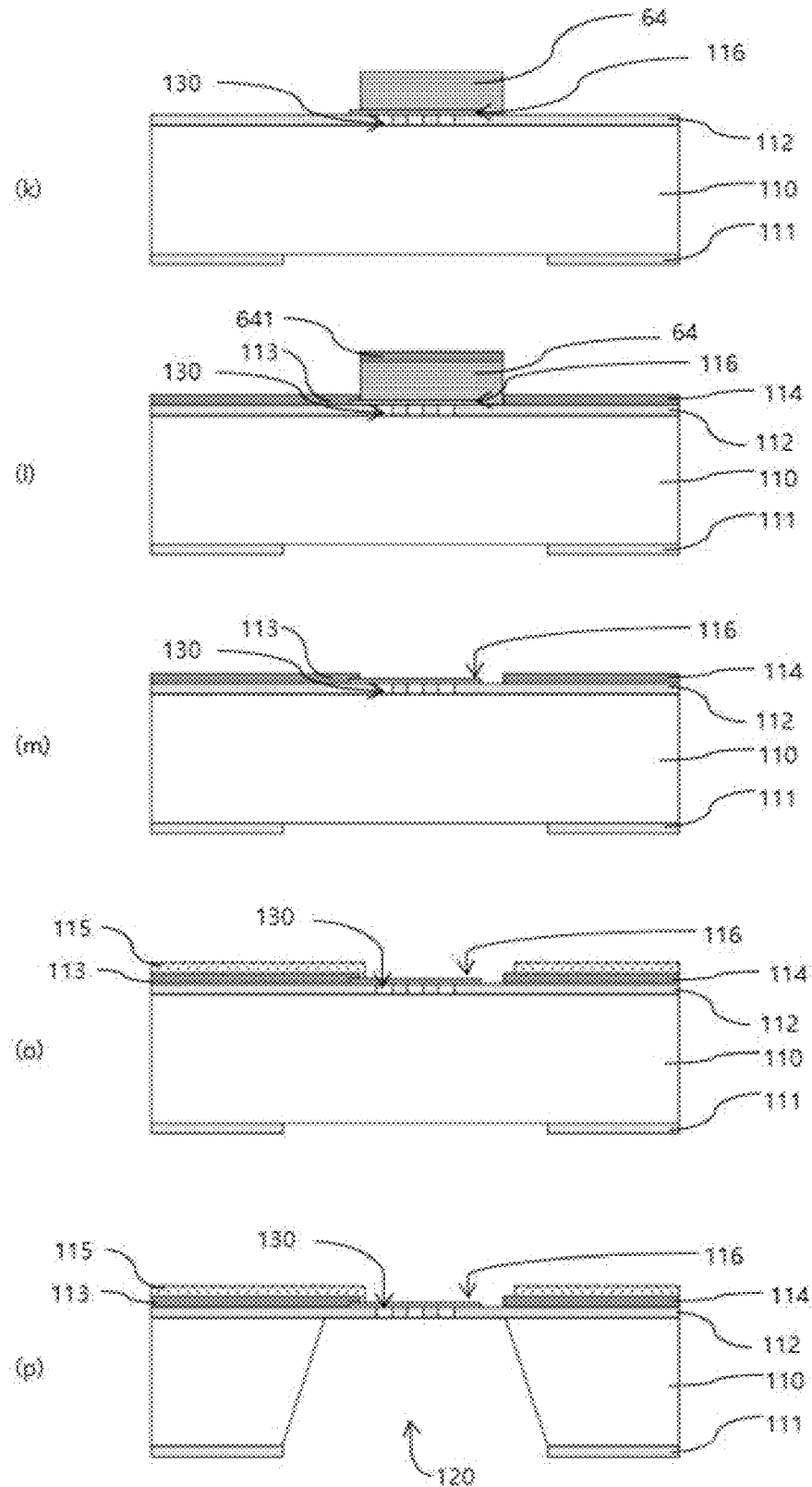

[FIG. 9]
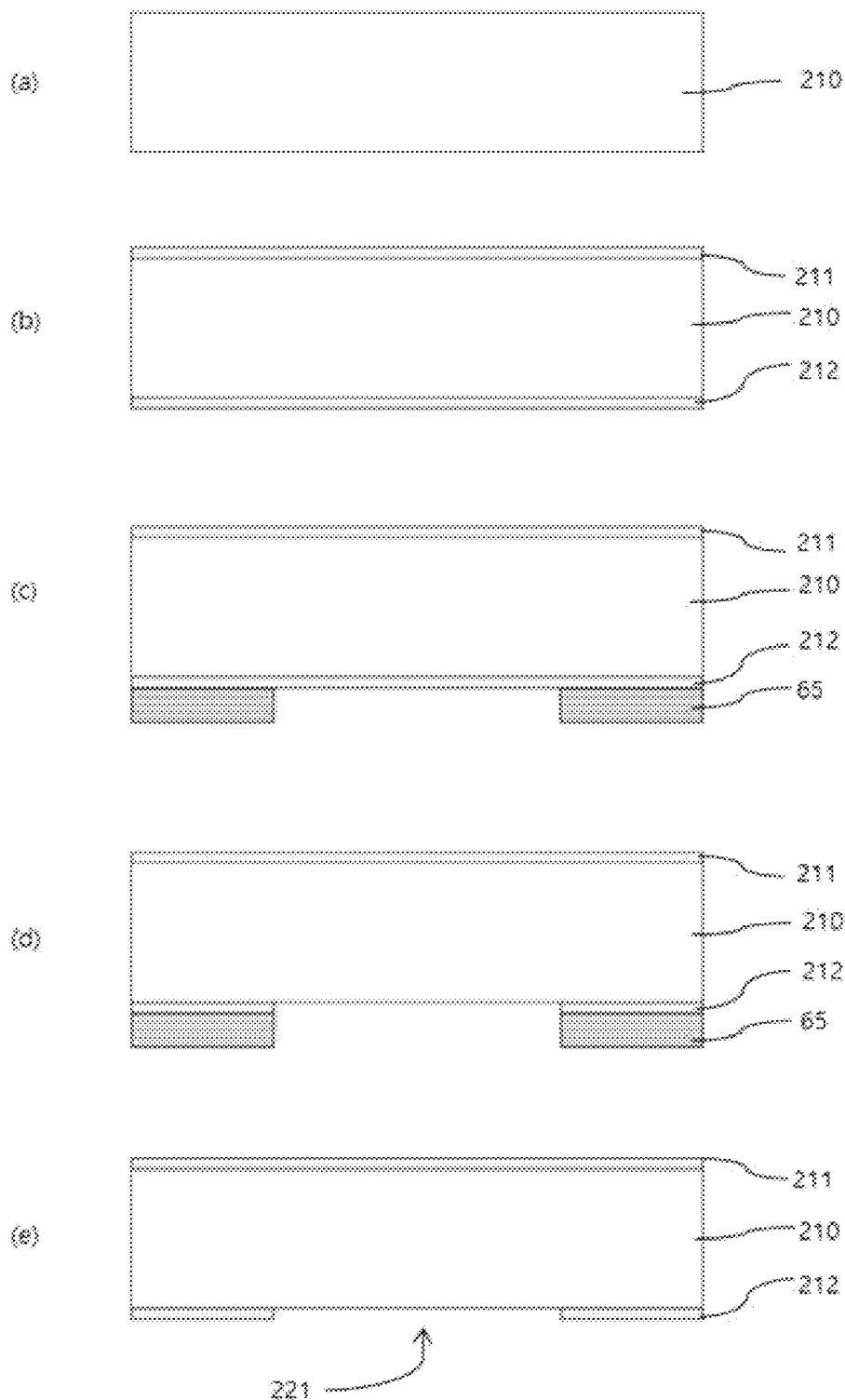

[FIG. 10]
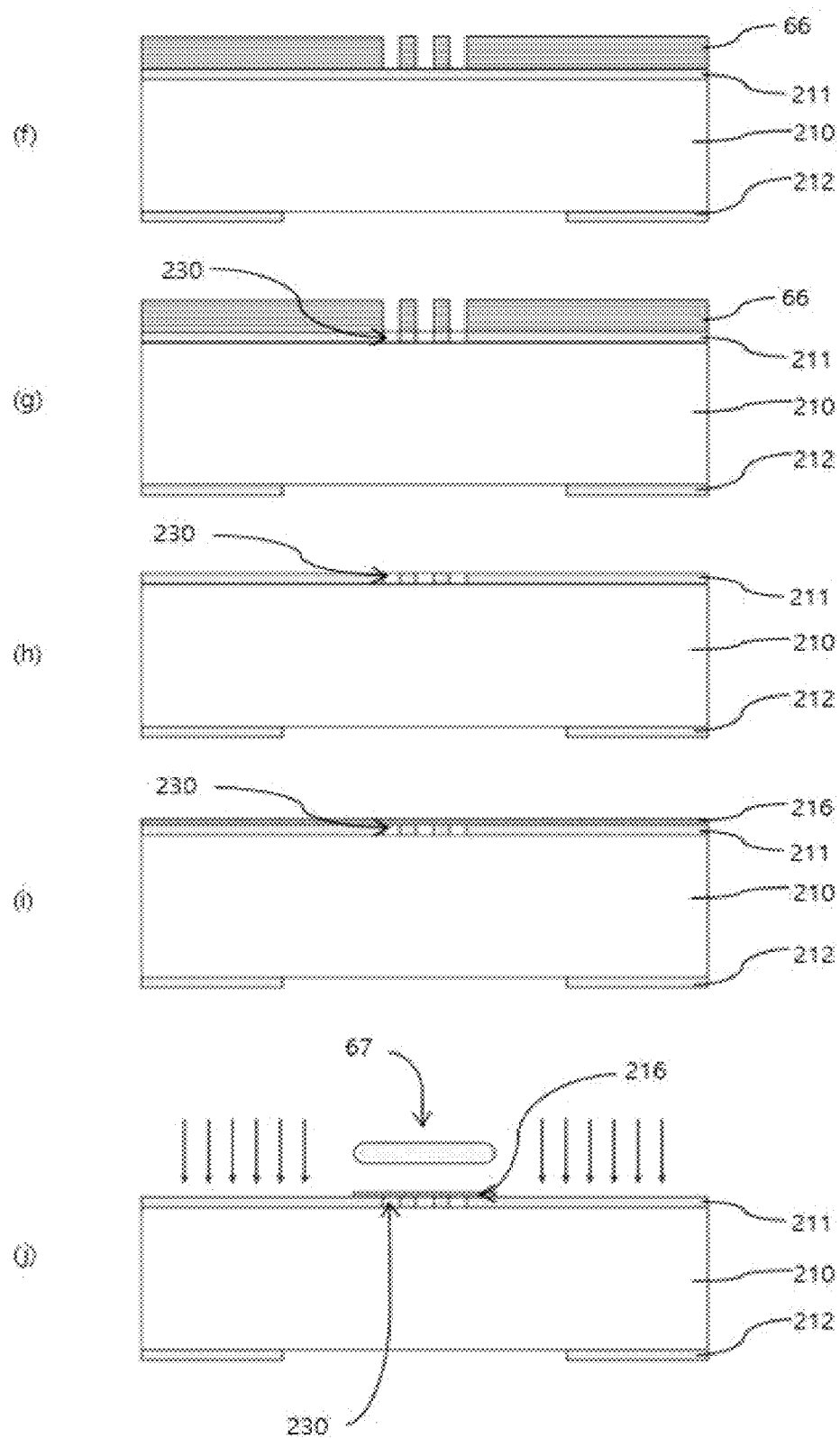

[FIG. 11]
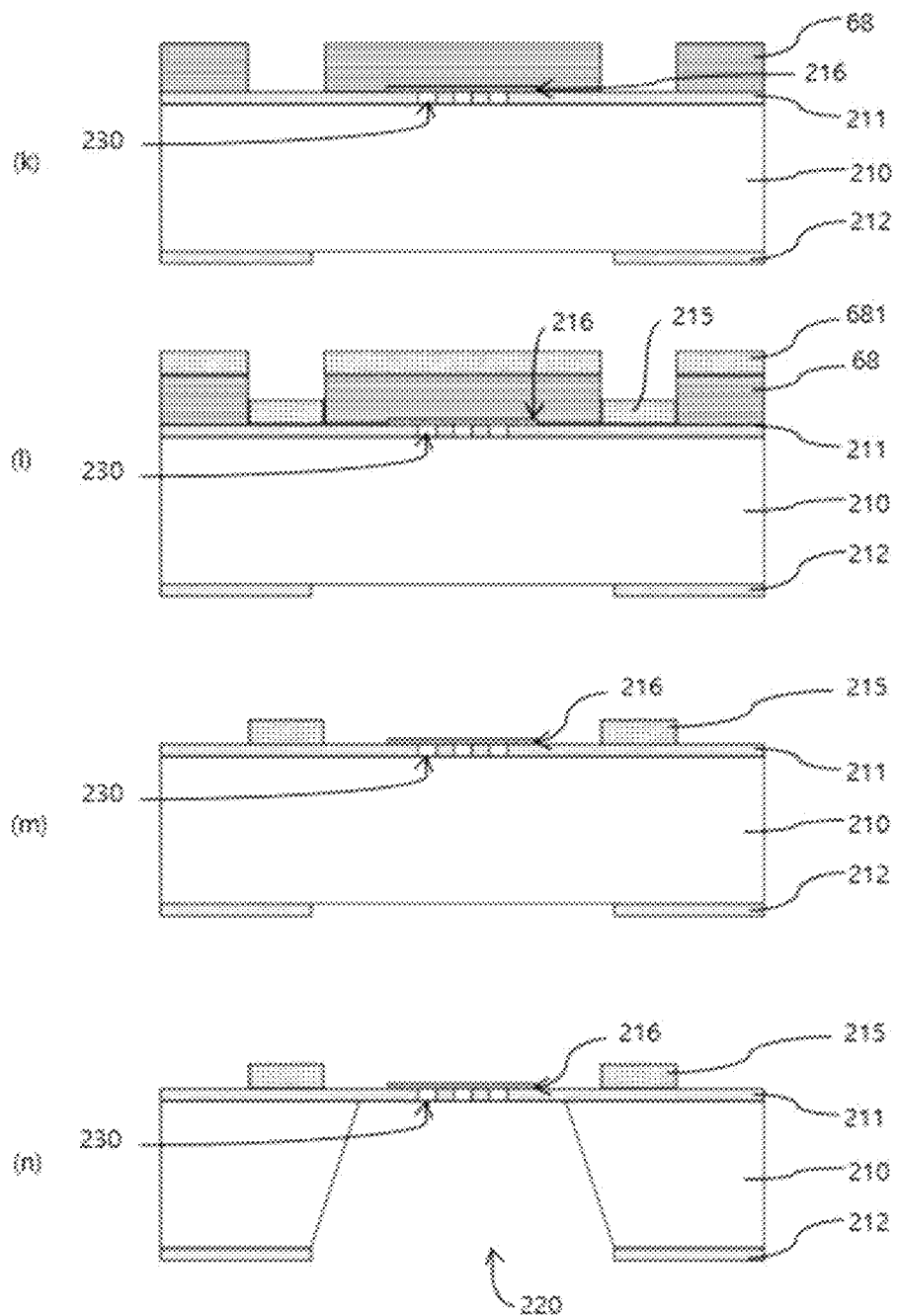

[FIG. 12]
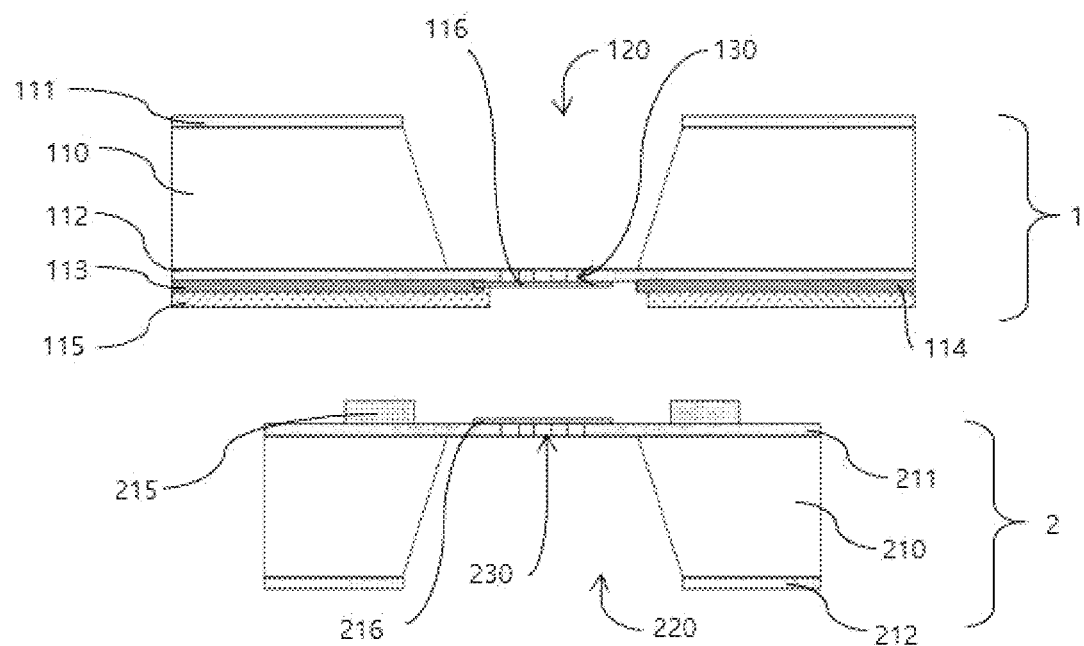

[FIG. 13]
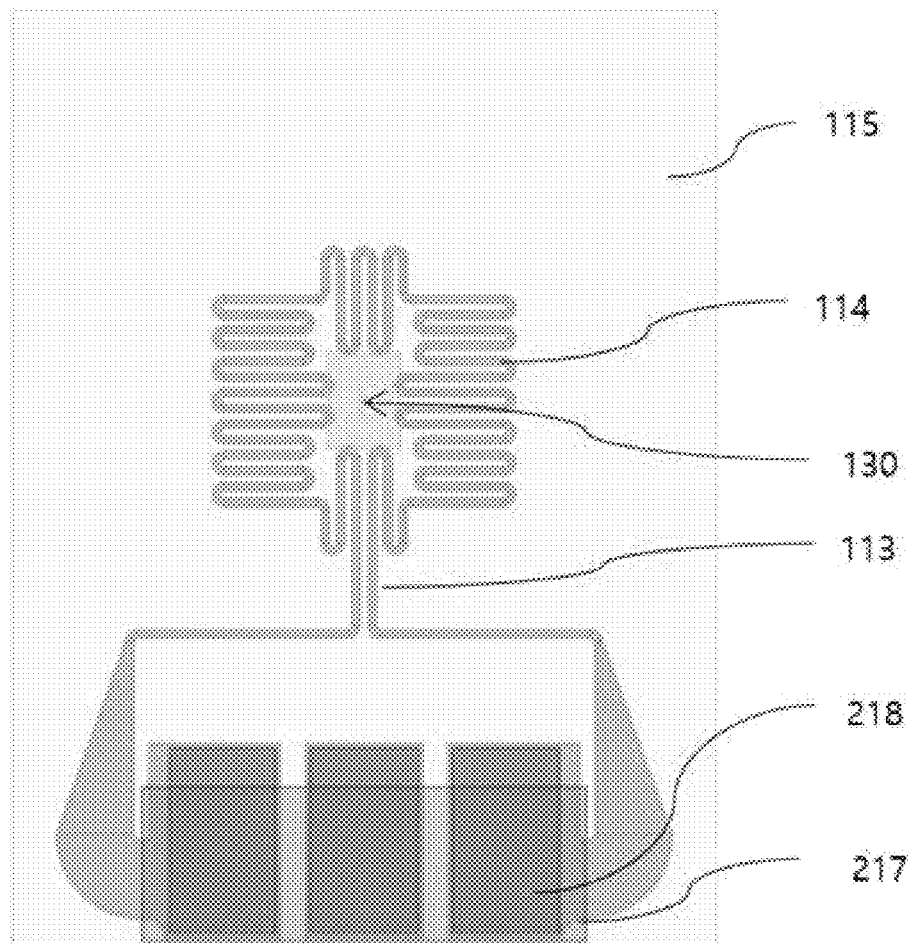

[FIG. 14]
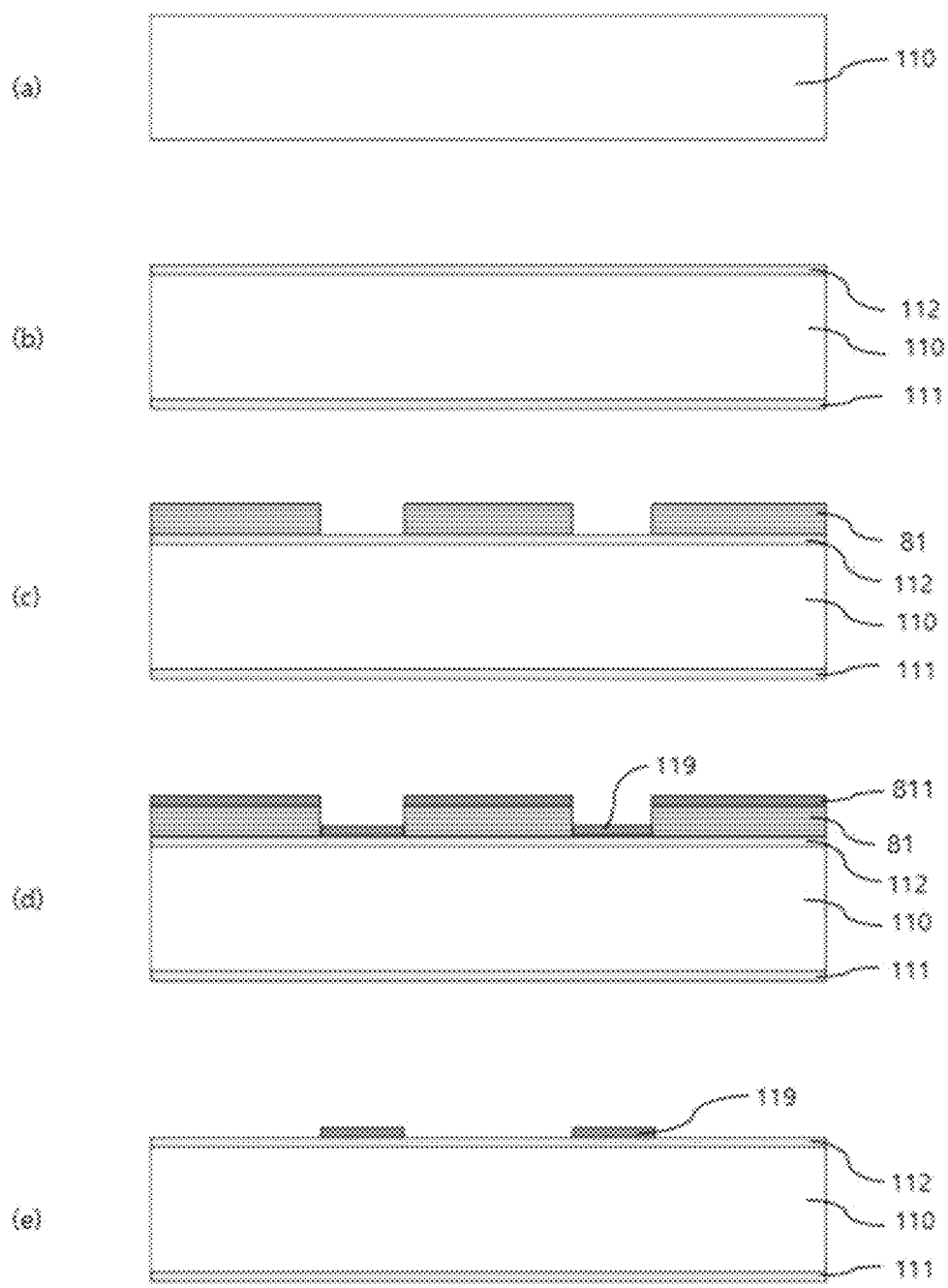

[FIG. 15]
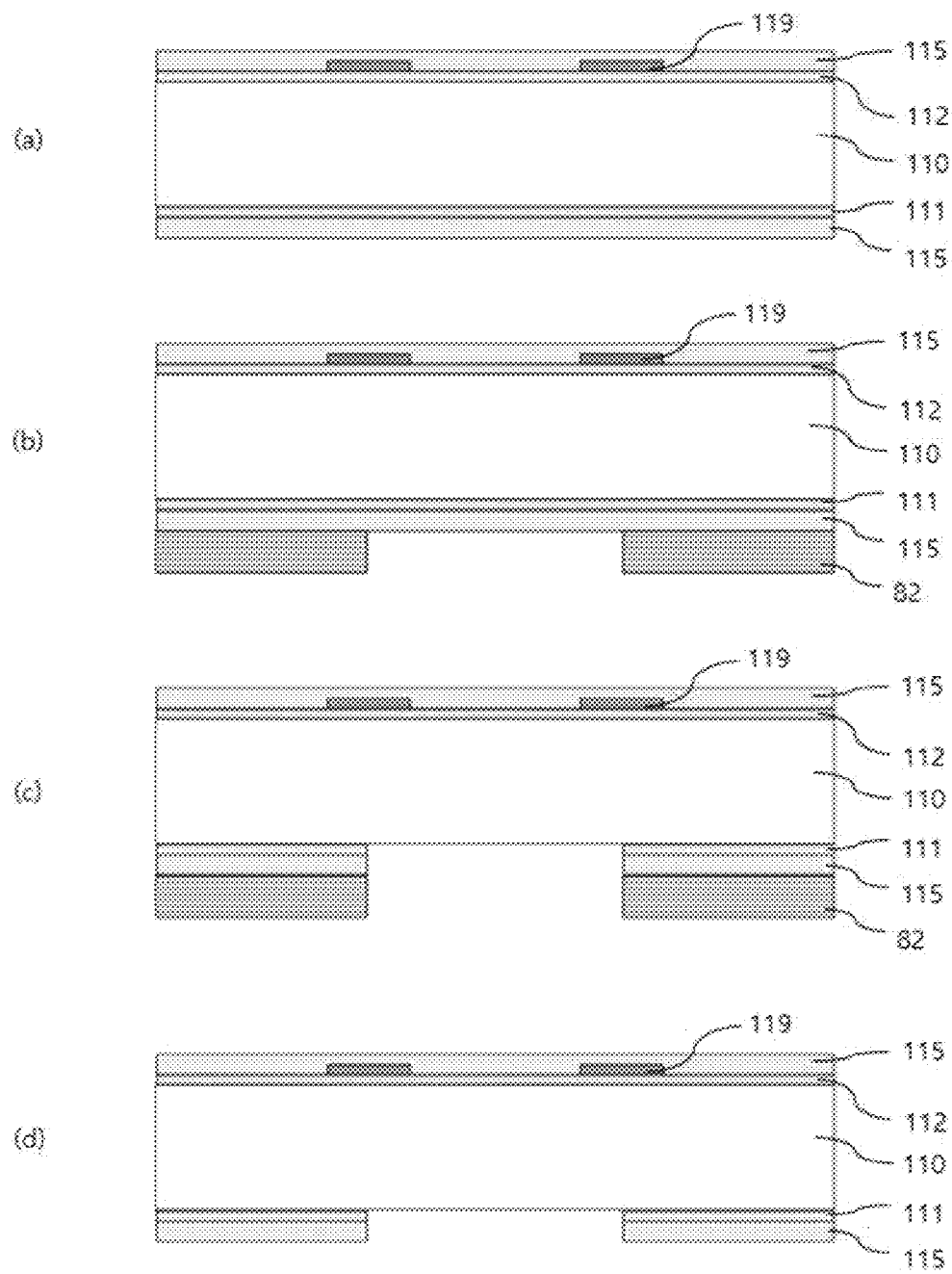

[FIG. 16]
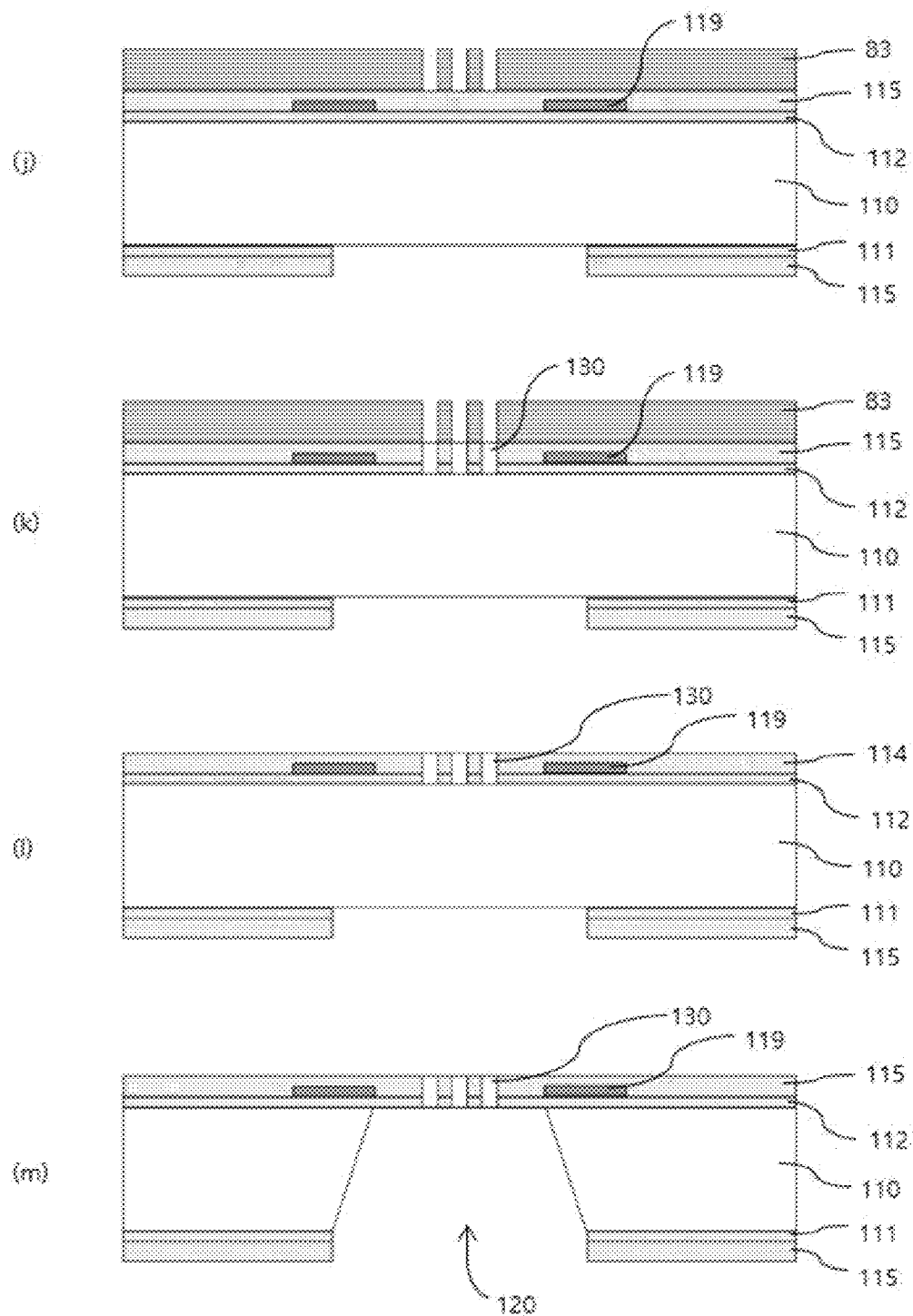

[FIG. 17]
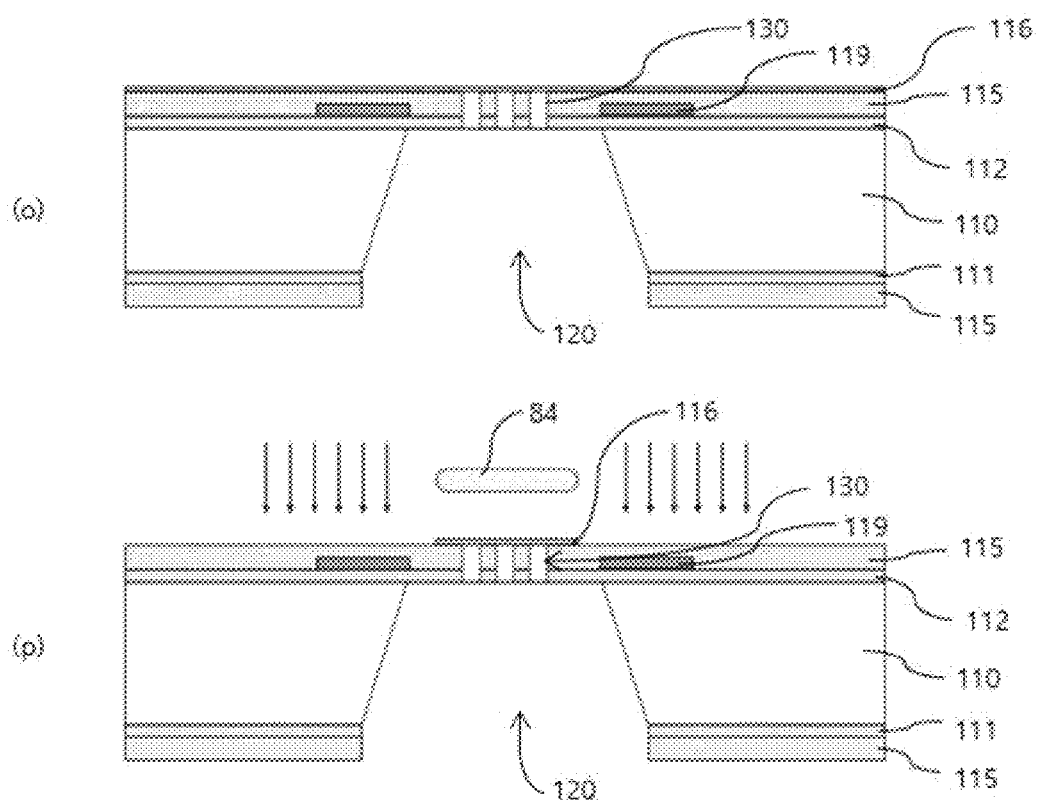

LIQUID CHIP FOR ELECTRON MICROSCOPE INCLUDING ELECTRODE

CROSS-REFERENCE(S) TO RELATED APPLICATIONS

This application claims priority to Korean Patent Application No. 10-2019-0129230, filed on Oct. 17, 2019, the disclosure of which is incorporated herein by reference in its entirety.

BACKGROUND OF THE DISCLOSURE

Field of the Disclosure

The present disclosure relates to an electrode liquid chip for an electron microscope, and more particularly, to a liquid chip for an electron microscope including an electrode which may observe a state of a supplied liquid sample in real time with high resolution, and furthermore, enable an electrochemical or thermochemical reaction analysis of the liquid sample.

Description of the Related Art

An electron microscope radiates the electron beam to a sample to magnify an internal microstructure and enables observing chemical reaction in the sample at high magnification. When using the electron microscope, an operator may accurately analyze chemical composition and reaction from several hundreds of microns to an atomic scale. At this time, a liquid chip may be provided to the electron microscope to dispose the liquid sample in the electron microscope. The liquid chip serves to contain the sample consisting of liquid to allow an operator to easily radiate the electron beam to the sample.

The liquid chip is widely used in a transmission electron microscope (TEM) among electron microscopes, and when the liquid chip is used in the TEM, a key object is to stably put the liquid in an apparatus maintained in ultra-high vacuum even if the spatial resolution, which is the biggest advantage of the TEM, is sacrificed. Accordingly, the material configuring the liquid chip is basically required to be impermeable to any material, but transparent to the electron beam, and high mechanical characteristics are required to stably maintain the structure from the pressure generated in the vacuum compartment.

The representative material is amorphous silicon nitride, which may be easily manufactured using a silicon-based process and may stably store liquid even inside vacuum. However, the thickness of the thin film is required to be maintained at several tens of nanometers or more to maintain the mechanical stability in vacuum, and thus, there is a problem in that a lot of inelastic scattering occurs when the electron beam transmits the thin film, thereby significantly decreasing the spatial resolution. Further, since the liquid chip mounted and used in the ultrahigh-vacuum has a very large difference between internal pressure and external pressure, the bulging phenomenon in which the silicon nitride thin film configuring the liquid chip bulges to the outside occurs, so that there occurs a problem in that the thickness of the liquid inside a liquid cell significantly becomes larger than an initial set value, thereby degrading the spatial resolution of the TEM.

With increasing interest of green energy, an electric vehicle, and the like, research on a next-generation battery with high performance and high stability to replace the currently commercialized lithium ion cell battery is actively conducted. To this end, the atomic level research relevant to the electrochemical battery operation mechanism which may observe an operation in real time using the TEM is required, but due to technological limitations, present analytical methodology is stayed on post-mortem or indirect lithiation behavior observation through the electron beam, and since these conventional analytical techniques do not observe the reaction based on real battery operation condition, there is a limit in which the accurate battery operation mechanism may not be confirmed.

Meanwhile, many reactions in nature require a specific temperature or more to overcome the energy barrier. In particular, to understand the accurate mechanism of the reaction activated in vivo or various semiconductor wet processes, high resolution observation means capable of precisely controlling the liquid temperature is required. However, as described above, since commercialized liquid heating chips are manufactured based on silicon nitride, the high resolution observation is impossible, and since the thickness of an insulating layer of a heating device is directly added to the thickness of the transmissive window, the insulating layer is manufactured by coating a soft photoresist having very poor weather resistance. An inefficient method in which a heater such as a heating coil heats the silicon chip without directly heating it in contact with the liquid, and the silicon indirectly heats the liquid secondarily is inevitably used. Accordingly, its applications are very limited, and there is a need to develop a platform for a liquid electron microscope which enables the high resolution analysis.

SUMMARY OF THE DISCLOSURE

An object of the present disclosure is to provide a liquid chip for a transmission electron microscope, which may minimize the loss of a spatial resolution and suppress the bulging effect of a liquid chip while accommodating a liquid sample in the transmission electron microscope more stably.

Another object of the present disclosure is to provide a liquid chip for an electron microscope including an electrode to enable the electrochemical or thermochemical reaction analysis of a liquid sample.

For achieving the objects, the present disclosure provides a liquid chip for an electron microscope including an upper chip; a lower chip; and a waterway space part formed by two or more spacers spaced apart from each other located between the upper chip and the lower chip, wherein respective upper surfaces of the upper chip and the lower chip are arranged to face each other, in which each of the upper chip and the lower chip includes: a substrate formed with a cavity penetrating the upper surface and a lower surface; a support disposed to include an upper surface of the substrate, and including a hole part formed with a plurality of holes in a region where the cavity of the upper surface is located; and a thin film layer transferred to cover the hole part, and made of a conductive two-dimensional material, and one end of each of a first electrode and a second electrode having a constant electrical conductivity is disposed in the vicinity of the hole part formed in the upper chip or the lower chip, and each of the other ends of the first electrode and the second electrode is disposed outside the waterway space part for electrical connection with an external electrical supply source.

The first electrode may be disposed in the form of surrounding a predetermined portion in the vicinity of the hole part.

One end of the second electrode may be disposed to extend to the upside of the hole part and formed with a corresponding electrode through hole on the plurality of holes formed in the hole part, disposed between the thin film layer and the hole part, and made of a conductive glassy carbon material.

Each of the other ends of the first electrode and the second electrode may be formed with a contact point part having a constant area for facilitating the electrical connection with an external electrical supply source.

A predetermined portion or more of the first electrode or the second electrode may be insulated by an insulation layer.

Additionally, according to the present disclosure, one end of a third electrode having a constant electrical conductivity may be disposed in the vicinity of the hole part formed in the upper chip or the lower chip, and the other end of the third electrode may be disposed outside the waterway space part for electrical connection with an external electrical supply source.

Further, according to the present disclosure, the respective one ends of the first electrode and the second electrode may be short-circuited with each other to be connected, and the first electrode and the second electrode may be made of a material having a constant resistance property, so as to be usable as a heating device.

At this time, the first electrode and the second electrode other than the respective one ends may be located inside the support, and insulated by an insulation layer.

According to the present disclosure, the substrate of the upper chip or the lower chip may be made of a silicon material, the support of the upper chip or the lower chip may be made of a silicon nitride or silicon oxide material, and the thin film layer of the upper chip or the lower chip may be made of at least any one selected from a group consisting of graphene, borophen, transition metal dichalcogenide (TMDC), and hexagonal-BN.

Further, the thin film layer of the upper chip or the lower chip may be disposed only inside the waterway space part.

According to the present disclosure, the support does not operate as the transmissive window due to the thin film layer made of the conductive two-dimensional material covering the hole part formed inside the waterway space part to be thicker than the conventional support and thus increases the bulging resistance, so that it is possible to minimize the loss of the spatial resolution while supplying the liquid sample more stably.

Further, the present disclosure may dispose the first and second electrodes having the constant electrical conductivity in the vicinity of the hole part formed in the upper chip or the lower chip, thereby confirming the electrochemical reaction of the liquid sample flowing through the waterway space part.

Further, according to the present disclosure, if the respective one ends of the first electrode and the second electrode are short-circuited with each other to be connected, and the first electrode and the second electrode connected to each other are made of a material having the constant resistive heating property, it is also possible to confirm the thermochemical reaction of the liquid sample as the heating device.

BRIEF DESCRIPTION OF THE DRAWINGS

FIG. 1 is an exploded perspective diagram of an upper chip of a liquid chip according to an exemplary embodiment of the present disclosure.

FIG. 2 is an exploded perspective diagram of the liquid chip according to the exemplary embodiment of the present disclosure and a holder for accommodating the liquid chip.

FIGS. 3A to 3D are cross-sectional diagrams of the upper chips of various forms of the liquid chip according to the exemplary embodiment of the present disclosure.

FIG. 4 is a cross-sectional diagram of the liquid chip in which the upper chip and the lower chip illustrated in FIG. 3A are laminated.

FIG. 5 is a cross-sectional diagram showing a state where the liquid chip illustrated in FIG. 4 is inserted into the holder.

FIGS. 6 to 8 are process flow diagrams showing a process of manufacturing the upper chip illustrated in FIG. 3A.

FIGS. 9 to 11 are process flow diagrams showing a process of manufacturing the lower chip of the liquid chip according to the exemplary embodiment of the present disclosure.

FIG. 12 is a cross-sectional diagram showing a state before the upper chip and the lower chip of the liquid chip according to the exemplary embodiment of the present disclosure are coupled to each other.

FIG. 13 is a plan diagram of an upper chip of a liquid chip according to another exemplary embodiment of the present disclosure.

FIGS. 14 to 17 are process flow diagrams showing a process of manufacturing the upper chip of the liquid chip according to another exemplary embodiment of the present disclosure.

DESCRIPTION OF SPECIFIC EXEMPLARY EMBODIMENTS

Advantages and features of the present disclosure, and methods for achieving them will be apparent with reference to the exemplary embodiments described below in detail together with the accompanying drawings. However, the present disclosure is not limited to the exemplary embodiments disclosed below but may be implemented in various different forms, and only the present exemplary embodiments are intended to complete the disclosure of the present disclosure and to provide to fully convey the scope of the disclosure to those skilled in the art to which the present disclosure pertains, and the present disclosure is defined only by the scope of the claims. The same reference numerals refer to the same components throughout the specification.

Further, the exemplary embodiments described herein will be described with reference to cross-sectional diagrams and/or plane diagrams, which are ideal exemplary diagrams of the present disclosure. In the drawings, the thicknesses of films and regions are exaggerated for effective explanation of technical content. Accordingly, forms of the exemplary diagrams may be deformed by manufacturing techniques and/or tolerances, or the like. Accordingly, the exemplary embodiments of the present disclosure are not limited to the shown specific forms but also include a change in the form generated according to the manufacturing process. For example, the etched region shown at a right angle may be rounded or a form having a predetermined curvature. Accordingly, the regions shown in the drawings have schematic attributes, and the shapes of the regions shown in the drawings are intended to exemplify a particular form of the region of the device and not for limiting the scope of the disclosure.

As shown in FIG. 4, a liquid chip 10 according to an exemplary embodiment of the present disclosure includes an upper chip 1, a lower chip 2, and a waterway space part 3 formed by two or more spacers 215 spaced apart from each other located between the upper chip 1 and the lower chip 2, and is arranged so that the respective upper surfaces of the upper chip 1 and the lower chip 2 face each other.

When the upper chip 1 and the lower chip 2 are laminated by the two or more spacers 215 spaced apart from each other, the waterway space part 3 for supplying a liquid sample is formed, and the height of a waterway space is determined according to the height of the spacer 215. The spacer 215 may be made of a metallic, ceramic, or polymer material.

The upper chip 1 and the lower chip 2 have substrates 110, 210 in which cavities 120, 220 penetrating the upper and lower surfaces are formed, respectively, and supports 111, 112, 211, 212 disposed thereon including at least the upper surface of the substrates 110, 210.

The supports 111, 112, 211, 212 may be generally disposed including the upper surfaces of the substrates 110, 210 through a deposition process, and in this process, the supports 111,112, 211, 212 may also be deposited and disposed on the entire surface of the substrates 110, 210. In order to maintain the mechanical characteristics of the upper chip 1 and the lower chip 2, the thicknesses of the substrates 110, 210 are preferably maintained to be thick at about several hundreds of microns. Accordingly, it is possible to sufficiently increase the thicknesses of the supports 111, 112, 211, 212 by the degree capable of sufficiently blocking the bulging effect, thereby blocking the bulging effect.

Hole parts 130, 230, composed of a plurality of holes in a region where the cavities 120, 220 are located penetrate the supports 112, 211 disposed on the upper surface. Accordingly, the hole parts 130, 230 of the upper and lower chips facing each other are preferably located on the same line so that the electron beam radiated from the transmission electron microscope is transmitted through the hole part 230 and the cavity 220 formed in the lower chip 2 via the cavity 120 and the hole part 130 formed in the upper chip 1.

The holes formed in the hole parts 130, 230 may be a circular shape, and may be formed in various shapes such as a square, rectangular, or triangular shape. The diameters of the holes formed in the hole parts 130, 230 may vary as several tens of microns or several tens of nanometers. The diameters of the holes and the thicknesses of the supports 112, 211 disposed on the upper surfaces may be appropriately adjusted so that the bowing of thin film layers 116, 216 does not occur. As an example, the thicknesses of the supports 112, 211 disposed on the upper surfaces may be from several tens of nanometers to several microns, and larger than the diameters of the holes.

The materials of the substrates 110, 210 may be silicon, and the materials of the supports 111, 112, 211, 212 may be silicon nitride or silicon oxide.

The hole parts 130, 230 of the upper and lower chips are transferred to be covered by the thin film layers 116, 216 made of a conductive two-dimensional material, respectively. The thin film layers 116, 216 are located inside the waterway space part 3 to which the liquid samples are supplied, and since the inside of the waterway space part 3 is required to maintain a very high pressure, the thin film layers 116, 216 are required to have the considerable physical tensile force. Accordingly, the thin film layers 116, 216 are preferably made of a material which maintains a single molecular layer of a conductive two-dimensional material structure, enables large-sized area growth and synthesis, and is transferrable to the large-sized area. The representative material may be at least any one selected from a group consisting of graphene, borophen, transition metal dichalcogenide (TMDC), and hexagonal-BN. Further, as necessary, the thin film layers 116, 216 may also exist in the form in which a plurality of single layers are laminated. The thin film layers 116, 216 cover the hole parts 130, 230 to enable the circulation of the liquid sample provided into the liquid chip 10, and to increase the resolution for observing the liquid sample due to the thin thickness of the atom level. It may be efficient that the thin film layers 116, 216 are formed by transferring and attaching graphene or the like in a dry or wet method in terms of process.

FIG. 1 is an exploded perspective diagram of the upper chip 1 of the liquid chip 10 according to an exemplary embodiment of the present disclosure. As illustrated in FIG. 1, the upper chip 1 of the liquid chip 10 according to the present disclosure has one ends of a first electrode 114 and a second electrode 113 having constant electrical conductivity formed in the vicinity of the corresponding hole parts 130, 230, and has the respective other ends of the first electrode 114 and the second electrode 113 disposed to extend outward from the waterway space part 3 for the electrical connection with the external electrical supply source (the electrodes 114, 113 are disposed on the upper chip 1 in FIG. 1).

Further, as necessary, one end of another third electrode 118 may be disposed in the vicinity of the hole parts of the upper chip 1 or the lower chip 2 disposed on the first electrode 114 and the second electrode 113, and the other end thereof may be disposed to extend outward from the waterway space part 3.

If the liquid chip 10 is used for an electric device, the first electrode 114, the second electrode 113, and the third electrode 118 may be used as a counter electrode, an operating electrode, and a reference electrode, respectively, and in this case, the electrodes should not be short-circuited with each other.

In order to observe the electrochemical experiment, particularly, the reduction reaction, a three-electrode system composed of three electrodes is advantageous. At this time, an active material in the liquid sample may be basically attached to one end of the second electrode (operating electrode) 113 extending to an observing region to generate a relative potential difference with the first electrode (counter electrode) 114, thereby causing the oxidation or the reduction reaction of the corresponding active material. At this time, the third electrode (reference electrode) 118 has the reduction reaction occurring in the liquid sample independently of the first electrode (counter electrode) 114 or the second electrode (operating electrode) 113, and the absolute potential value of the reaction which occurs between the first electrode (counter electrode) 114 and the second electrode (operating electrode) 113 may be specified through the potential measured at this time.

A predetermined portion including one end of the first electrode 114 may be disposed in the form of surrounding a predetermined portion in the vicinity of the selected upper hole part 130. In FIG. 1, it may be confirmed that the predetermined portion is disposed in the form of maintaining the same distance with respect to the hole part 130 and surrounding in a C shape. In this case, the first electrode 114 may be present on the same distance in a plane from the active material attached to one end of the second electrode 113, thereby evenly forming a gradient of a constant voltage, that is, an electric field.

One end of the second electrode 113 may be disposed to extend to the hole part 130, which is because the active material attached to one end of the second electrode 113 may extend to an electron beam transmissive region to be easily observed. In this case, if an electrode through hole 131 corresponding to the plurality of holes formed in the hole part 130 is formed, it may make it easier to observe the second electrode.

One end of the second electrode 113 may be more preferably disposed between the thin film layer 116 and the corresponding hole part 130, which is because it is possible to thin the waterway space of the liquid sample by the thickness of the second electrode 113, thereby enabling better resolution imaging.

Further, one end of the second electrode 113 may be made of a conductive glassy carbon material, which is because the material is a material capable of easily transmitting the electron beam while having a high affinity with the thin film layer 116 which is a two-dimensional material.

The other ends of the first electrode 114, the second electrode 113, and the third electrode 118 are preferably formed with a contact point part 217 having a constant area at a corresponding location so as to be easily in contact with a holder contact point part 530 formed on the lower holder 5 in order to facilitate the electrical connection with the external electrical supply source.

As illustrated in FIG. 2, in order for the contact point part 217 formed at one side of the upper chip 1 not to be covered by the lower chip 2, the upper chip 1 of a portion where the contact point part 217 is formed is preferably arranged in a protruding form because of having a larger size than that of the lower chip 2. Further, if the thin film layers 116, 216 made of a two-dimensional material cover the contact point part 217, an electrical blocking may occur from the holder external electrode 530 to the contact point or a short circuit may occur between the contact points, so that the thin film layers 116, 216 are preferably transferred only into the waterway space part 3 from the beginning, and more preferably, the thin film layers 116, 216 are transferred only to the transmissive window in the vicinity of the hole parts 130, 230, or entirely transferred and then a necessary portion is preferably removed using an etching means or the like. Further, if the liquid chip 10 is used for the electric device and the thin film layers 116, 216 have the electrical conductivity, the respective electrodes are preferably disposed not to be short-circuited with each other by the thin film layers 116, 216, and for example, only the second electrode 113 may be disposed inside the thin film layers 116, 216.

Predetermined portions or more of the first electrode 114, the second electrode 113, and the third electrode 118 may be insulated by an insulation layer 115, and as necessary, some portions located inside the waterway space part 3 may also be processed not to be insulated by the insulation layer 115 for the smooth electrochemical reaction.

As shown in FIG. 2, the liquid chip 10 according to the present disclosure is inserted in a space between a holder upper portion 4 and a holder lower portion 5, and lower and upper gasket O-rings 520, 420 may be used for constant shock prevention. The electron beam radiated from the transmission electron microscope may penetrate the holders 4, 5 to reach the liquid sample of the liquid chip 10 because holder through parts 410, 510 formed in each of the holder upper portion 4 and the holder lower portion 5 and the upper chip and lower chip cavities 120, 220 of the liquid chip 10 are located on the same line.

Since the holder lower portion 5 has the holder contact point part 530 which is formed on a portion contacting the electrodes 113, 114 formed at one side of the upper chip 1 of the liquid chip 10, the liquid chip 10 receives constant electrical stimulus from the external electrical supply source through an electrical wire 531. Further, the holder lower portion 5 is formed with a fluid injection tube 311, a fluid drainage tube 321, a holder fluid injection part 310, and a holder fluid drainage part 320 for injection and drainage of the liquid sample. The holder lower portion 5 is formed with the fluid injection tube 311, the fluid drainage tube 321, the holder fluid injection part 310, and the holder fluid drainage part 320 for injection and drainage of the liquid sample. The liquid sample is injected from an external liquid injection pump to the holder through the holder fluid injection part 310, and the liquid is delivered to the holder fluid injection part 320 extending to the end, which is the contact point part 217 of the liquid chip 10. Finally, the liquid sample is supplied to the waterway space part 3 on the liquid chip 10. The liquid sample coming from the liquid chip 10 may be finally delivered to the fluid drainage tube 321 through the holder fluid drainage part 320 to be collected.

Hereinafter, various shapes of the upper chips 200 of the liquid chip 10 according to the exemplary embodiment of the present disclosure will be described with reference to FIGS. 3A to 3D. This is to dispose the electrode on the upper chip 1 for ease of explanation, and as necessary, the electrode may also be disposed on the lower chip 2. Further, the liquid chip 10 to be described below is a case of being used for the electric device, and the first electrode 114, the second electrode 113, and the third electrode 118 are referred to as the counter electrode 114, the operating electrode 113, and the reference electrode 118, respectively.

The upper chip 1 shown in FIG. 3A is the exemplary embodiment of the most basic electrode arrangement, and since the thin film layer 116, which is a conductive two-dimensional material, contacts the operating electrode 113, the thin film layer 116 is used as a portion of the operating electrode 113, and when a current is applied to liquid electrolyte or the like, the reaction occurring around the operating electrode 113 may be observed in real time with high resolution. At this time, the path of the current proceeds in the order of the operating electrode 113→the thin film layer 116→the reactant material→the electrolyte→the counter electrode 114, and in the case of the three-electrode system including the reference electrode, the reference electrode may be disposed to be in contact with the electrolyte at the outer portion (not shown). In FIG. 3A, since the operating electrode 113 is not in direct contact with the liquid sample due to the insulation layer 115, only the thin film layer 116 which is the conductive two-dimensional material, not causing the electrochemical reaction is in contact with the liquid sample, thereby minimizing the influence of other factors on the experiment other than the active material in the case of the secondary cell experiment.

The upper chip 1 shown in FIG. 3B has a form of extending and perforating the operating electrode 113 to the region of the holder part 130, and then disposing the thin film layer 116 thereon, and at this time, the thin film layer 116 may extend to the upper portion of the insulation layer 115 and disposed so that the liquid and the operating electrode are not in direct contact with each other in order to minimize the involvement of the reaction of the operating electrode 113 itself. In this case, since the thin film layer 116 located on the electrode determines the space where the electrolyte is accommodated, it is possible to thin the thickness of the entire waterway, thereby performing a better high resolution experiment.

FIGS. 3C and 3D show a case of coupling another conductive material 117 to one end of the operating electrode 113. The conductive material may be conductive glassy carbon. The order of the conductive material 117 coupled at this time has its own low conductivity, so that if all the operating electrodes 113 are replaced with the corresponding material, the characteristics of the device are very lowered, but since the physical properties (relatively high electron transmissive property due to low atomic number, good physical/chemical affinities and contact property with graphene, good electrochemical stability, the degree of being not involved in the reaction, or the like) other than the conductivity are excellent, the conductive material 117 means a material having the considerable advantage when disposed on one end of the operating electrode 113. FIG. 3C is a diagram showing an example of exposing one end of the operating electrode 113 to the waterway portion, and disposing another conductive material 117 between the thin film layer 116 and the operating electrode 113.

FIG. 3D shows a case of disposing the thin film layer 116 on the upper portion of the conductive material 117 of one end of the operating electrode 113 in order to obtain the effect in which the thickness of the liquid sample becomes thinner as illustrated in FIG. 3B.

Hereinafter, the sequence of manufacturing the upper chip 1 of the liquid chip 10 for the high resolution electron microscope according to the exemplary embodiment of the present disclosure will be described with reference to FIGS. 6 to 8. For reference, the electrode may also be arranged on the lower chip 2 as necessary, and is not necessarily limited to a process procedure to be described below, and it is apparent that some or all of the respective processes may be replaced with another manufacturing means used in a process of manufacturing a general liquid chip and the sequence of each step may be interchanged or omitted at a level of not affecting the result.

Further, the upper chip 1 shown in FIGS. 6 to 8 is one shown in FIG. 3A and corresponds to the electric device use. Accordingly, as described above, the first electrode 114, the second electrode 113, and the third electrode 118 are referred to as the counter electrode 114, the operating electrode 113, and the reference electrode 118, respectively.

FIG. 6A illustrates the substrate 110, such as a silicon material having both surfaces polished, which is the starting material of the process.

In FIG. 6B, the supports 112, 111 operating as an insulating film are deposited on the upper surface and the rear surface of the substrate 110. At this time, the thicknesses of the supports 112, 111 operate as the thickness of a support means of the thin film layer 116, and may be deposited in the thickness of units of several tens of nanometers to several microns, but appropriately about several hundreds of nanometers. At this time, materials of the supports 112, 111 are a ceramic material such as silicon nitride or silicon oxide and appropriately a material which is hard enough to maintain the structure when suspended without the support in units of several microns and has excellent electrical insulation, chemical resistance, physical rigidity, and the like. The materials of the supports 112, 111 may be made of the same or different materials as necessary.

In FIG. 6C, a portion of a lower support 111 not required to be etched is protected using a photoresist 61 to form the lower exposure on the lower support 111. At this time, a method such as optical lithography or electron beam lithography may be used.

In FIG. 6D, the lower support 111 of a region not protected by the photoresist 61 is removed using an apparatus such as inductively coupled plasma (ICP)-reactive ion etching (RIE), and FIG. 6E shows a state where the photoresist has been removed for the post-process.

In FIG. 7F, a processing process of manufacturing the hole part 130 operating as the transmissive window on an upper support 112, and a portion of the upper support 112 not required to be etched is protected using a photoresist 62. FIG. 7G shows a process of removing a portion corresponding to the hole part 130 of the upper support 112 using the mechanism such as the ICP-RIE. FIG. 7H shows a state of having removed the photoresist 62 for the post-process. FIG. 7I shows an image having transferred the thin film layer 116 which is a two-dimensional material capable of operating as a portion of the transmissive window or the operating electrode on the upper support 112. At this time, the thin film layer 116 may be necessarily conductive or non-conductive and may be generally graphene. The thin film layer 116 may be attached to the upper portion of the upper support 112 using a dry transfer method, a wet transfer method, or the like. FIG. 7J shows a process of removing a material of the thin film layer 116 which exists in a portion other than a desired region in order to prevent the side effects such as an electrical short circuit caused by the thin film layer 116, and shows a method for peeling, partially burning, and removing the material using laser, physical and chemical etching, plasma, or the like. The method shown in the drawing is a method for removing graphene using high energy plasma such as oxygen having strong straightness, and protects the transmissive window portion using a shadow mask 63 through which plasma does not transmit and exposes the other portions to the plasma.

FIG. 8 shows a method for depositing the electrical conductive material in the waterway used as the operating electrode, the counter electrode, the reference electrode, and the like, shows that all electrodes are deposited at one time with the electrode material of the same material, and each electrode may be also configured differently or omitted by repeating a process corresponding to FIGS. 8K to 8M or other methods. The electrode material may be manufactured by various methods or materials according to the user's needs, such as conductive metal, ceramic, conductive polymer, or composite material. FIG. 8K is for using a lift-off method, which is a representative method of the metal deposition processes, and shows a process of protecting a device using a photoresist 64 in a region where the metal is not required to be deposited on the upper portion of the upper chip 1. FIG. 8I shows a process of depositing a metallic thin film entirely on the upper portion, and FIG. 8M is a diagram showing that the metallic thin film is formed at a location where the electrode is required to be formed after a process of removing a protective film of the photoresist 64 using solvent or the like to remove a metallic residue 641 deposited on the photoresist together. At this time, the thickness of the electrode is preferably deposited to be thin because it operates as the waterway directly or indirectly to be involved in the thickness of the liquid, but is preferably deposited at about several tens to several hundreds of nanometers in order to prevent a voltage drop due to the resistance as an element configuring an electrical circuit. FIG. 8O shows that the insulation layer 115 is deposited for the passivation or insulating treatment of the electrode. Accordingly, it is possible to prevent causing secondary reaction and damaging the electrode caused by the electrode directly exposed to the electrolyte, and at this time, the insulation layer 115 may be a hard ceramic protective layer or formed of a soft epoxy-based photoresist (for example, SU-8) or the like. The insulation layer 115 is also preferably deposited to be thin for the same reason as the electrode but is preferably formed at about several tens to several hundreds of nanometers in order to prevent device defects such as the breakdown or short circuit caused by an electric field. FIG. 8P is a diagram showing a process of forming the cavity 120 by wet-etching the silicon substrate using a basic solution or the like with respect to the substrate on which all upper elements are formed. At this time, KOH, aqueous ammonia, TMAH, or the like may be used as the etchant.

FIGS. 9 to 11 show an exemplary process for representing a process of manufacturing the lower chip 2 of the liquid chip 10, and it is apparent that in the method for manufacturing a target device, some or all of the respective processes may be replaced with another manufacturing means used in a typical electronic device manufacturing process and the sequence of each step may be interchanged or omitted at a level of not affecting the result.

For reference, since the lower chip 2 of the liquid chip 10 according to the present disclosure is commonly used regardless of whether it is an electric device or a heating device, the manufacturing process thereof is also the same.

FIG. 9A shows the substrate 210 made of a material, such as silicon having both surfaces polished, which is the starting material of the process. In FIG. 9B, the supports 212, 211 used as the insulating films of the upper surface and the rear surface of the substrate 210 are deposited. At this time, the thicknesses of the supports 212, 211 operate as the thicknesses of supporting the thin film layer 216, and may be deposited in the thickness of units of several tens of nanometers to several microns, but appropriately several hundreds of nanometers. At this time, a material of the lower supports 212, 211 is a ceramic material such as silicon nitride or silicon oxide and appropriately a material which is hard enough to maintain the structure when suspended without the support in units of several microns and has excellent electrical insulation, chemical resistance, physical rigidity, or the like. The materials of the lower supports 212, 211 of the upper surface and the lower surface may consist of the same or different materials as necessary. In FIG. 9C, a portion not required to be etched on the material of the insulating film is protected using a photoresist 65 on the lower surface in order to form the lower exposure on a lower support 212. At this time, a method such as optical lithography or electron beam lithography may be used. FIG. 9D shows a process of removing the lower support 212 in a region not protected by the photoresist 65 using an apparatus such as the ICP-RIE. In FIG. 9E, the photoresist is removed for the post-process.

FIG. 10F shows a processing process of manufacturing the hole part 230 operating as the thin film layer 216 on an upper support 211, and a process of protecting a portion on the upper support 211 not required to be etched using a photoresist 66. FIG. 10G shows a process of removing a portion corresponding to the hole part 230 of the upper support 211 using an apparatus such as the ICP-RIE. FIG. 10H shows a state after the photoresist 66 is removed for the post-process. FIG. 10I is a diagram showing that the thin film layer 216, which is a two-dimensional material capable of also operating as a portion of the transmissive window or the operating electrode, is transferred on the upper support 211. At this time, a material of the thin film layer 216 may be conductive or non-conductive and graphene is generally preferred. The thin film layer 216 may be attached to the upper portion of the substrate using a dry transfer method, a wet transfer method, or the like. FIG. 10J shows a process of removing the two-dimensional material existing in a portion other than the desired region in order to prevent the side effects such as the electrical short circuit due to the thin film layer 216, which is a two-dimensional material, and one of the methods for peeling, partially burning, and removing the material using laser, physical and chemical etching, plasma, or the like. The exemplified method is a method for removing graphene using high-energy plasma such as oxygen having strong straightness, and protects the transmissive window portion using a shadow mask 67 through which plasma does not transmit and exposes the other portions to the plasma.

FIG. 11 is one of various methods for forming the spacer 215, and the spacer may be manufactured by various methods or materials according to the user's needs, such as a metal, a ceramic, a polymer, or a composite material. FIG. 11K is for using a lift-off method, which is a representative method of the metal deposition processes, and shows a process of protecting the device using a photoresist 68 in a region where a metal is not required to be deposited on the device. FIG. 11L shows a process of depositing a metallic thin film entirely on the upper portion, and FIG. 11M is a diagram showing that the metallic thin film is formed at a location where the spacer 215 is required to exist after a process of removing a protective film of the photoresist 68 using a solvent or the like to remove a metallic residue 681 deposited on the photoresist together. At this time, the spacer 215 is preferably deposited at about several tens to several microns. FIG. 11N is a diagram showing a process of forming the lower chip cavity 220 by wet-etching the silicon substrate using a basic solution or the like with respect to the substrate on which all upper elements have been formed. At this time, KOH, aqueous ammonia, TMAH, or the like may be used as the etchant.

FIG. 12 is an exploded plane diagram showing a state before the upper chip 1 and the lower chip 2 manufactured through the manufacturing process are coupled to each other, and the liquid chip 10 may be inserted into an auxiliary mechanism such as a holder.

FIG. 13 shows the upper chip 1 of the liquid chip 10 according to another exemplary embodiment of the present disclosure, which may be used as a heating device. As illustrated in FIG. 13, the respective one ends of the first electrode 114 and the second electrode 113 are short-circuited with each other to be connected, and thus, a constant current is moved through the first electrode 114 and the second electrode 113. At this time, the first electrode 114 and the second electrode 113 generate constant heat because they are made of a material having resistance heating property. Accordingly, a fine analysis according to the thermochemical reaction of the liquid sample is possible.

The first electrode 114 and the second electrode 113 disposed on the upper chip 1 used as the heating device may also be located inside the support 112 other than the respective one ends while being short-circuited with each other to be connected, as necessary.

Hereinafter, the sequence of manufacturing the upper chip 1 of the liquid chip 10 for the electron microscope according to another exemplary embodiment of the present disclosure, which may be used as a heating device, will be described with reference to FIGS. 14 to 17. As described above, the electrodes may also be arranged on the lower chip 2 as necessary, and is not necessarily limited to the process procedures to be described below, and it is apparent that some or all of the respective processes may be replaced with another manufacturing means used in a typical liquid chip manufacturing process and the sequence of each step may be interchanged or omitted at a level of not affecting the result.

FIG. 14A shows the substrate 110 made of a material such as silicon having both surfaces polished, which is the starting material of the process.

In FIG. 14B, the supports 112, 111 operating as an insulating film are deposited on the upper surface and the rear surface of the upper substrate 110. At this time, the thickness of the supports 112, 111 operates as the thickness of a support means of the thin film layer 116, and may be deposited in the thickness of units of several tens of nanometers to several microns, but appropriately several hundreds of nanometers. At this time, materials of the supports 112, 111 are a ceramic material such as silicon nitride or silicon oxide, and appropriately a material which is hard enough to maintain the structure when suspended without the support in units of several microns and has excellent electrical insulation, chemical resistance, physical rigidity, and the like. The materials of the supports 112, 111 may be the same or different materials as necessary.

FIGS. 14C to 14E are one of various methods for forming a heating electrode 119 on an upper support 112, and the heating electrode 119 may be manufactured by various methods or materials according to the user's needs such as metal, nonmetal, ceramic, or composite material having a constant resistance property so that resistance heating property (so called Joule Heating) due to a current is possible. FIG. 14C is for using the lift-off method, which is a representative method of the metal deposition methods, and shows a process of protecting the device using a photoresist 81 in a region where a metal is not required to be deposited on the upper portion. FIG. 14D shows a process of depositing a metallic thin film entirely on the upper portion, and FIG. 14E is a diagram showing that the metallic thin film is formed at a location where a heating body is required to exist after a process of removing a protective film of the photoresist 81 using a solvent or the like to remove a metallic residue 811 deposited on the photoresist together.

FIG. 15A shows that the insulation layer 115 is deposited for the passivation or the insulating treatment of the heating electrode 119 deposited on the upper support 112. Accordingly, it is possible to prevent the secondary reaction or the damage to the electrode in advance caused by the heat electrode 119 directly to the electrolyte, and at this time, the insulation layer 115 may be a hard ceramic protective layer or formed of a soft epoxy-based photoresist (for example, SU-8), or the like. At this time, since the thickness of the heating electrode 118 or the thickness of the insulation layer 115 does not operate as the waterway, thereby not affecting the thickness of the liquid, and thus is preferably formed at about several ten to several hundreds of nanometers at which device defects such as insulation breakdown and short circuit are prevented as necessary. In FIG. 15B, since the cavity 120 is required to be formed by etching the substrate 110 for exposure in order to use the upper support 112 and the insulation layer 115 as a support, a portion not required to be etched on the insulation layer 115 is protected using a photoresist 82 on the lower end in order to expose the lower portion for starting the etching. At this time, a method such as optical lithography or electron beam lithography may be used. FIG. 15C is a diagram showing a process of removing the support 111 in a region not protected by the photoresist 82 using the apparatus such as the ICP-RIE. In FIG. 15D, the photoresist 82 is easily removed for the post-process.

FIG. 16J shows a forming process of manufacturing the hole part 130 to operate as the transmissive window of the two-dimensional material, and a process of protecting a portion of the insulation layer 115 not required to be etched using a photoresist 83. FIG. 16K shows a process of removing a portion corresponding to the hole part 130 of the support 112 using the apparatus such as the ICP-RIE. FIG. 16L shows a state after the photoresist 83 is removed for the post-process. FIG. 16M is a diagram showing a process of forming the cavity 120 by wet-etching the substrate 110 using a basic solution or the like with respect to the substrate where all upper elements have been formed. At this time, KOH, aqueous ammonia, TMAH, or the like may be used as the etchant.

FIG. 17O shows an image of having transferred the thin film layer 116, which is a two-dimensional material, operating as the transmissive window on the upper insulation layer 115. At this time, the two-dimensional material may be conductive or non-conductive and graphene is generally preferred. The thin film layer 116 may be attached to the upper portion of the substrate 110 using a dry transfer method, a wet transfer method, or the like. FIG. 17P shows a process of removing a portion of the thin film layer 116 existing in a portion other than the desired region in order to prevent the side effects such as an electrical short circuit caused by the thin film layer 116, and one of the methods for peeling, partially burning, and removing the portion using laser, physical and chemical etching, plasma, or the like. The exemplified method is a method for removing graphene using high-energy plasma such as oxygen having strong straightness, and protects the hole part 130 which is the transmissive window using a shadow mask 84 through which plasma does not transmit and exposes the other portions to the plasma.

As described above, although the exemplary embodiments of the present disclosure have been described with reference to the accompanying drawings, those skilled in the art to which the present disclosure pertains may understand that the present disclosure may be embodied in other specific forms without changing the technical spirit or the essential features thereof. Accordingly, it should be understood that the described exemplary embodiments are illustrative in all respects and are not limitative.

What is claimed is:

1. A liquid chip for an electron microscope, the liquid chip comprising:
    an upper chip;
    a lower chip;
    first and second electrodes that are formed in the upper chip or the lower chip and that have a constant electrical conductivity; and
    a waterway space part located between the upper chip and the lower chip and formed by two or more spacers spaced apart from each other,
    each of the upper chip and the lower chip comprising:
        a lower surface;
        an upper surface facing one of the upper chip and the lower chip;
        a substrate formed with a cavity penetrating the upper surface and the lower surface;
        a support disposed on one side of the substrate, the support comprising a hole part formed in a region where the cavity of the upper surface is located; and
        a thin film layer transferred to cover the hole part, and made of a conductive two-dimensional material, and
    wherein each of the first electrode and the second electrode has one end disposed in a vicinity of the hole part formed in the upper chip or the lower chip and another end disposed outside the waterway space part for electrical connection with an external electrical supply source, and
    wherein the one end of the second electrode contacts the thin film layer and the one end of the first electrode does not contact the thin film layer.

2. The liquid chip of claim 1, wherein the one end of the first electrode includes a predetermined portion surrounding the hole part and the vicinity of the hole part.

3. The liquid chip of claim 2,
wherein the respective one ends of the first electrode and the second electrode are electrically connected to each other, and
wherein the first electrode and the second electrode are made of a material having a constant resistance heating property.

4. The liquid chip of claim 3, wherein the first electrode and the second electrode other than the respective one ends are located inside the support.

5. The liquid chip of claim 3, wherein the first electrode and the second electrode are insulated by an insulation layer.

6. The liquid chip of claim 1, wherein the one end of the second electrode extends to the hole part and is formed with an electrode through hole.

7. The liquid chip of claim 6, wherein the hole part is formed with a plurality of holes, and the electrode through hole corresponds to the plurality of holes formed in the hole part.

8. The liquid chip of claim 6, wherein the one end of the second electrode is disposed between the thin film layer and the hole part.

9. The liquid chip of claim 1, wherein the one end of the second electrode is made of a conductive glassy carbon material.

10. The liquid chip of claim 1, wherein each of the other ends of the first electrode and the second electrode is formed with a contact point part having a constant area for facilitating the electrical connection with an external electrical supply source.

11. The liquid chip of claim 1, further comprising an insulation layer for insulating at least a predetermined portion of the first electrode or the second electrode.

12. The liquid chip of claim 1, further comprising a third electrode having a constant electrical conductivity,
wherein the third electrode has one end disposed in the vicinity of the hole part formed in the upper chip or the lower chip and another end disposed outside the waterway space part for electrical connection with the external electrical supply source.

13. The liquid chip of claim 1, wherein the substrate of the upper chip or the lower chip is made of a silicon material.

14. The liquid chip of claim 1, wherein the support of the upper chip or the lower chip is made of a silicon nitride or silicon oxide material.

15. The liquid chip of claim 1, wherein the thin film layer of the upper chip or the lower chip is made of at least one selected from a group consisting of graphene, borophen, transition metal dichalcogenide (TMDC), and hexagonal-BN.

16. The liquid chip of claim 1, wherein the thin film layer of the upper chip or the lower chip is disposed only inside the waterway space part.

17. A liquid chip for an electron microscope comprising an upper chip; a lower chip; and a waterway space part formed by two or more spacers spaced apart from each other located between the upper chip and the lower chip, wherein respective upper surfaces of the upper chip and the lower chip are arranged to face each other,
wherein each of the upper chip and the lower chip comprises: a substrate formed with a cavity penetrating the upper surface and a lower surface; a support disposed to comprise an upper surface of the substrate, and comprising a hole part formed with a plurality of holes in a region where the cavity of the upper surface is located; and a thin film layer transferred to cover the hole part, and made of a conductive two-dimensional material,
wherein each one end of a first electrode and a second electrode having a constant electrical conductivity is disposed in the vicinity of the hole part formed in the upper chip or the lower chip, and each of the other ends of the first electrode and the second electrode is disposed outside the waterway space part for electrical connection with an external electrical supply source, and
wherein one end of the second electrode is disposed to extend to the hole part and formed with an electrode through hole corresponding to the plurality of holes formed in the hole part.

18. A liquid chip for an electron microscope comprising an upper chip; a lower chip; and a waterway space part formed by two or more spacers spaced apart from each other located between the upper chip and the lower chip, wherein respective upper surfaces of the upper chip and the lower chip are arranged to face each other,
wherein each of the upper chip and the lower chip comprises: a substrate formed with a cavity penetrating the upper surface and a lower surface; a support disposed to comprise an upper surface of the substrate, and comprising a hole part formed with a plurality of holes in a region where the cavity of the upper surface is located; and a thin film layer transferred to cover the hole part, and made of a conductive two-dimensional material,
wherein each one end of a first electrode and a second electrode having a constant electrical conductivity is disposed in the vicinity of the hole part formed in the upper chip or the lower chip, and each of the other ends of the first electrode and the second electrode is disposed outside the waterway space part for electrical connection with an external electrical supply source, and
wherein one end of a third electrode having a constant electrical conductivity is disposed in the vicinity of the hole part formed in the upper chip or the lower chip, and the other end of the third electrode is disposed outside the waterway space part for electrical connection with an external electrical supply source.

* * * * *